US010924091B2

(12) United States Patent
Goyal (10) Patent No.: US 10,924,091 B2
(45) Date of Patent: Feb. 16, 2021

(54) IMMEDIATE FAIL DETECT CLOCK DOMAIN CROSSING SYNCHRONIZER

(71) Applicant: STMicroelectronics International N.V., Geneva (CH)

(72) Inventor: Avneep Kumar Goyal, Greater Noida (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 16/460,191

(22) Filed: Jul. 2, 2019

(65) Prior Publication Data

US 2021/0006237 A1 Jan. 7, 2021

(51) Int. Cl.
*H03K 3/037* (2006.01)
*H03K 19/21* (2006.01)
*H03L 7/00* (2006.01)

(52) U.S. Cl.
CPC ........... *H03K 3/0375* (2013.01); *H03K 19/21* (2013.01); *H03L 7/00* (2013.01)

(58) Field of Classification Search
CPC ....................................................... H03L 7/00
See application file for complete search history.

(56) References Cited

U.S. PATENT DOCUMENTS

| 4,589,066 A | 5/1986 | Lam et al. |
|---|---|---|
| 4,696,019 A | 9/1987 | Tulpule et al. |
| 5,256,912 A | 10/1993 | Rios |
| 5,680,644 A | 10/1997 | Sager |
| 5,987,081 A * | 11/1999 | Csoppenszky ............ G06F 5/06 326/93 |
| 6,895,061 B1 | 5/2005 | Stong |
| 7,242,737 B2 * | 7/2007 | Lake ..................... H04L 7/0012 375/372 |
| 7,243,255 B2 | 7/2007 | Cox, Jr. et al. |
| 7,288,973 B2 * | 10/2007 | Zerbe ....................... G06F 1/12 327/144 |
| 8,732,639 B1 | 5/2014 | Fung et al. |
| 9,342,640 B1 | 5/2016 | Fung et al. |
| 9,768,776 B1 | 9/2017 | Lundberg |
| 9,793,894 B1 | 10/2017 | Lundberg |
| 2004/0267846 A1 | 12/2004 | Hars et al. |
| 2009/0153182 A1 | 6/2009 | Yamaoka et al. |
| 2012/0166856 A1 | 6/2012 | Bal et al. |

\* cited by examiner

*Primary Examiner* — Hai L Nguyen
(74) *Attorney, Agent, or Firm* — Slater Matsil, LLP (57) ABSTRACT

A synchronizer circuit includes a first synchronizer having a first input for receiving a signal associated with a first clock signal, a second input for receiving a second clock signal, and an output for providing a synchronizer circuit output signal; a second synchronizer having a first input for receiving the signal associated with the first clock signal, a second input for receiving the second clock signal, and an output; a detection stage having a first input coupled to the output of the first synchronizer and to the output of the second synchronizer, a second input for receiving the second clock signal, and an output; and a fault output stage having a first input coupled to the detection stage, a second input for receiving the second clock signal, and an output for providing a fault output signal.

20 Claims, 13 Drawing Sheets

IMMEDIATE FAIL DETECT CLOCK DOMAIN CROSSING SYNCHRONIZER

TECHNICAL FIELD

The present invention relates generally to a system and method for providing immediate fail detection for a clock domain crossing synchronizer.

BACKGROUND

Figure 1:
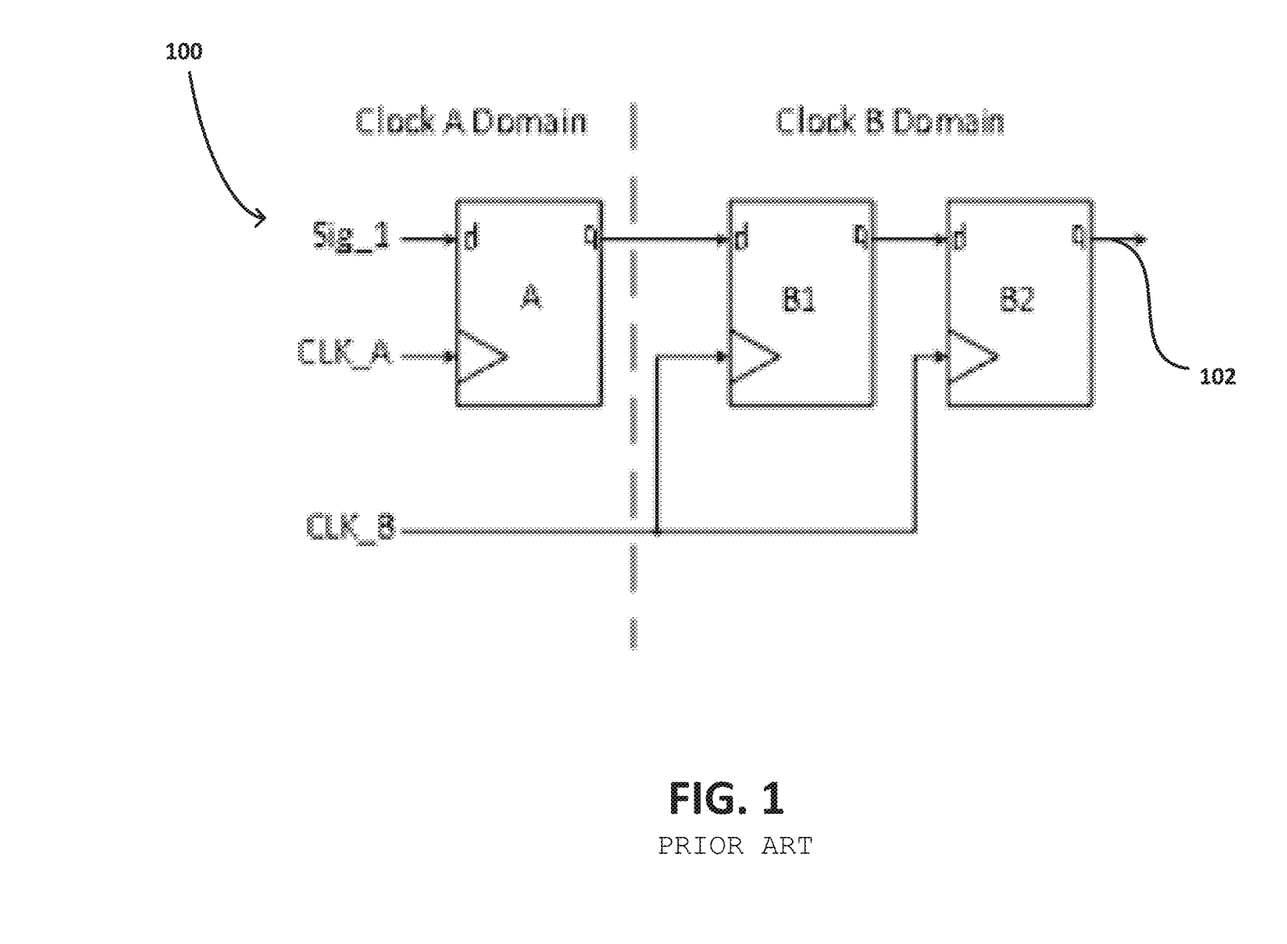
FIG. 1 is a schematic diagram of an exemplary synchronizer.

A conventional two flip-flop synchronizer 100 is used for synchronizing a single bit level signal $Sig_1$ as is shown in FIG. 1. Flip-flop A operates in the clock A domain and flip-flops $B_1$ and $B_2$ operate in the clock B domain. The clock A domain and the clock B domain are asynchronous clock domains. Flip-flop A receives the input signal $Sig_1$ at the "D" input, and is clocked by the first clock signal $CLK_1$ at the clock input. The input signal $Sig_1$ is transferred to the "Q" output of flip-flop A by the action of the first clock signal $CLK_A$ as is known in the art. Flip-flops $B_1$ and $B_2$ are clocked by the second clock signal $CLK_B$, and the output signal at the "Q" output of flip-flop A is serially transferred through each of flip-flops $B_1$ and $B_2$ to the final "Q" output at output node 102.

Figure 2:
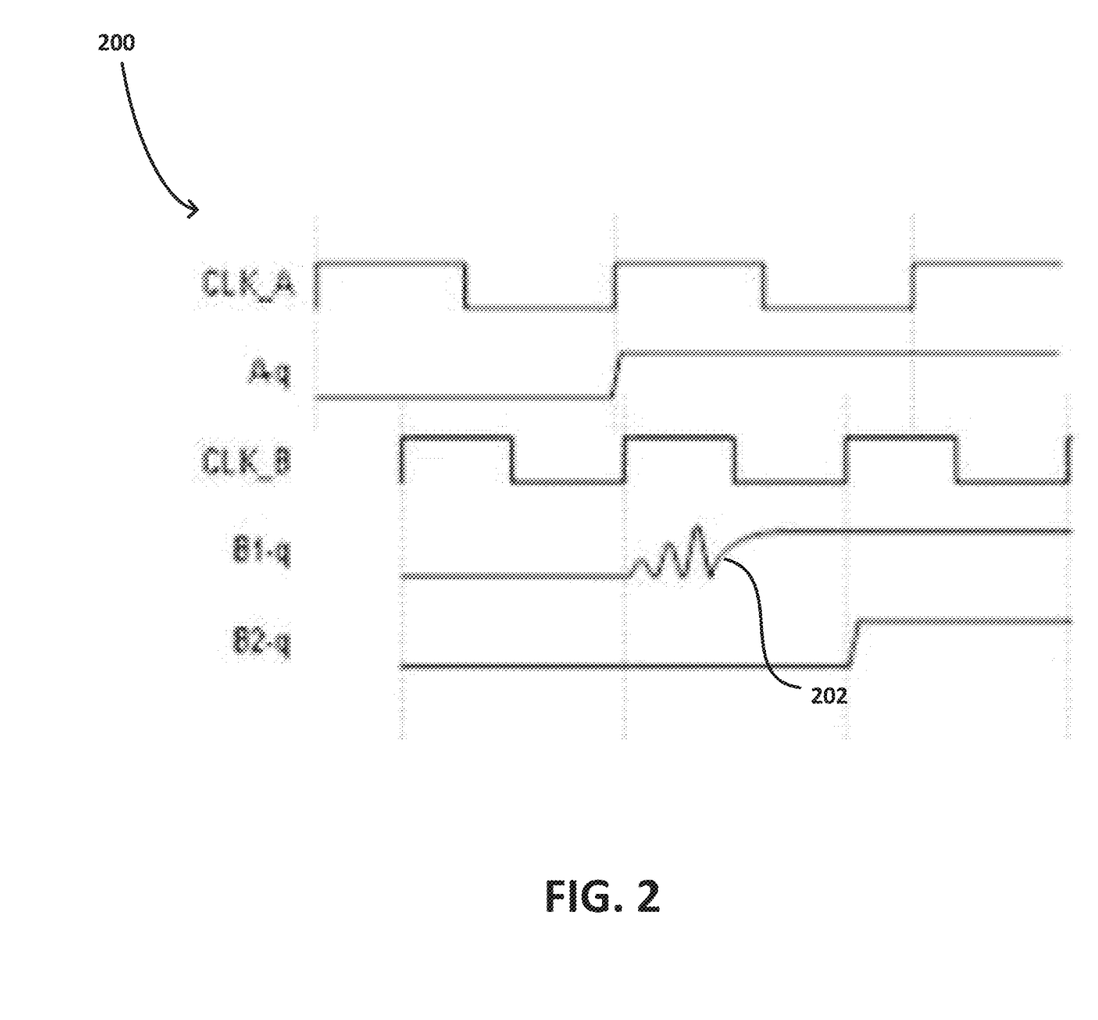
FIG. 2 is a timing diagram associated with the exemplary synchronizer of FIG. 1.

FIG. 2 shows a timing diagram 200 of the synchronizer 100 shown in FIG. 1. Waveforms associated with the $CLK_A$ signal, the "Q" output of flip-flop A, the $CLK_B$ signal, the "Q" output of flip-flop $B_1$, and the "Q" output of flip-flop $B_2$ are shown. There is probability that while sampling the input "D" input by flip-flop $B_1$ in the $CLK_B$ clock domain, the "Q" output of flip-flop $B_1$ may go into metastable state 202. But during the one clock cycle period of the $CLK_B$ clock signal associated with the metastable state 202, the output "Q" output of flip-flop $B_1$ may settle to some stable value (in the case shown in FIG. 2, the stable value is a logic one value). The output of flip-flop $B_2$ can also go to metastable state if flip-flop $B_1$ does not settle to a stable value during the one clock cycle period associated with the metastable state 202, but the probability for flip-flop $B_2$ to be metastable for a complete clock cycle is very close to zero.

SUMMARY

In accordance with an embodiment, a synchronizer circuit comprises a first synchronizer having a first input for receiving a signal associated with a first clock signal, a second input for receiving a second clock signal, and an output for providing a synchronizer circuit output signal; a second synchronizer having a first input for receiving the signal associated with the first clock signal, a second input for receiving the second clock signal, and an output; a detection stage having a first input coupled to the output of the first synchronizer and to the output of the second synchronizer, a second input for receiving the second clock signal, and an output; and a fault output stage having a first input coupled to the detection stage, a second input for receiving the second clock signal, and an output for providing a fault output signal.

In accordance with another embodiment, a system comprises a plurality of synchronizer circuits, each synchronizer circuit having a first input for receiving a first signal associated with a first clock domain, a second input for receiving a clock signal of a second clock domain, a first output for providing a synchronizer circuit output signal, and a second output for providing a fault output signal; a controller having a plurality of inputs each coupled to a corresponding first output of the plurality of synchronizer circuits; and a fault control and collection unit coupled to a corresponding second output of the plurality of synchronizer circuits.

In accordance with another embodiment, a synchronization method for a synchronizer circuit comprises receiving a signal associated with a first clock domain; receiving a clock signal associated with a second clock domain; providing a synchronized output signal associated with the second clock domain; and providing a fault output signal indicative of a fault associated with at least one synchronizer of the synchronizer circuit.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

In the ensuing description one or more specific details are illustrated, aimed at providing an understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

A synchronizer circuit and method having both a synchronizer output and a fault detection output are described herein, according to embodiments. The synchronizer circuit includes a primary synchronizer for providing the synchronizer output, and a secondary synchronizer and additional logic circuitry including a detection stage and a fault output stage for providing the fault detection output. A plurality of serially-coupled flip-flops is used in each of the primary and secondary synchronizers. The number of serially-coupled flip-flops that are used can be flexibly increased to any number of synchronization stages, which can be decided based on the Mean Time Between Failure (MTBF) value of the synchronizer. The synchronizer circuit, according to embodiments, can detect a logic high fault immediately while and a logic low fault is detected when the input will transitions to a logic high value. The operation of the synchronizer circuit can be made more robust in embodiments by implementing Triple-Voting Flip-flops (TVFs) in the last two logic circuit stages (the detection stage and the fault output stage).

Electronic systems such as automotive systems can be implemented as a System on a Chip (SoC) that is an integrated circuit including all of the components of the system, often including, for example, components associated with different and asynchronous clock domains. While synchronizer circuits are known for synchronizing the various signals associated with the different clock domains, failure of these synchronizer circuits can in turn lead to failure of critical components in the system. Failure of one or more components in, for example, an automotive system is a major safety issue.

Safety in SoC is required in many applications ranging from Aerospace applications to applications associated with the Internet of Things (IoT). Automotive SoCs are designed to comply with safety guidelines such as, for example, the ISO 26262 Functional Safety Standard. These guidelines include qualitative and quantitative measures to ensure implementation of safety mechanisms in system design.

For the reasons given above, circuits, interfaces, and subsystems of a system that cross clock domains should implement safety mechanisms that detect a fault associated with crossing the clock domain and either correct the fault or allow the system to take corrective action.

Clock domain crossing is implemented at many places in the frontend design of a system including in safety relevant critical designs. Clock domain crossing is highly used in SoC frontend integration because of asynchronous clock domain crossing of control and data signals. Failure of synchronizers in the system can thus create safety issues as discussed above. Therefore, to obviate these safety issues, the synchronizers used in system designs need their own safety mechanisms as is advantageously provided by embodiment synchronizer circuits described in further detail below.

Figure 3:
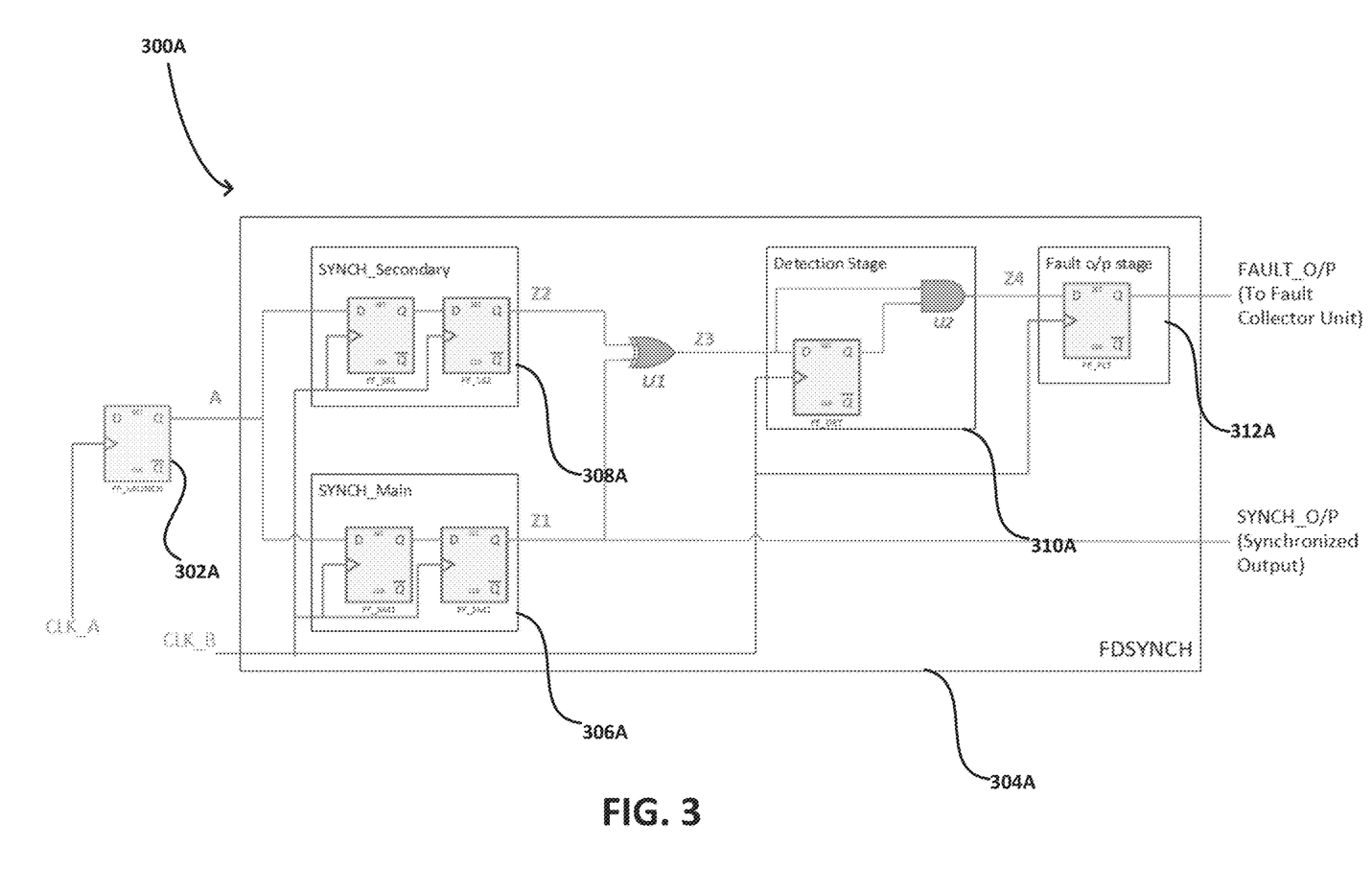
FIG. 3 is a schematic diagram of a synchronizer circuit having a synchronizer circuit output and a fault output according to an embodiment.

FIG. 3 is a schematic diagram of a synchronizer circuit 300A having a synchronizer circuit output $SYNCH_{O/P}$ and a fault output $FAULT_{O/P}$ according to an embodiment. Synchronizer circuit 300A includes a first portion 302A generally associated with a first clock domain ($CLK_A$) and a second portion 304A (FDSYNCH) generally associated with a second clock domain ($CLK_B$). Synchronizer circuit 300A comprises a first synchronizer 306A having a first input for receiving a signal (A) associated with a first clock signal ($CLK_A$), a second input for receiving a second clock signal ($CLK_B$), and an output ($Z_1$) for providing a synchronizer circuit output signal ($SYNCH_{O/P}$). Synchronizer circuit 300A also comprises a second synchronizer 308A having a first input for receiving the signal (A) associated with the first clock signal ($CLK_A$), a second input for receiving the second clock signal ($CLK_B$), and an output ($Z_2$).

Synchronizer circuit 300A also comprises a detection stage 310A having a first input ($Z_3$) coupled to the output of the first synchronizer 306A (through XOR gate $U_1$ described in further detail below) and to the output of the second synchronizer 308A (through XOR gate $U_1$ described in further detail below), and a second input (clock input of the $FF_{DET}$ flip-flop described in further detail below) for receiving the second clock signal ($CLK_B$), and an output $Z_4$. Finally, synchronizer circuit 300A also includes a fault output stage 312A having a first input $Z_4$ coupled to the detection stage 310A, a second input (clock input of the $FF_{FLT}$ flip-flop described in further detail below) for receiving the second clock signal $CLK_B$, and an output (Q output of the $FF_{FLT}$ flip-flop described in further detail below) for providing a fault output signal ($FAULT_{O/P}$).

In an embodiment, the first portion 302A of the synchronization circuit 300A comprises a D-type flip-flop designated FF LAUNCH on the CLKA clock signal and for generating the signal (A) as previously discussed.

D-type flip-flops are known in the art and typically include a clock input, a SET input, a CLR input, and Q and inverted Q outputs. Some or all of the inputs and outputs are connected to other circuit components, in embodiments.

The first synchronizer 306A is also designated $SYNCH_{MAIN}$ and includes two serially-coupled D-type flip-flops designated $FF_{SM1}$ and $FF_{SM2}$. The first synchronizer 306A receives the signal (A) and the second clock signal $CLK_B$, and provides the $Z_1$ signal as shown in FIG. 3.

The second synchronizer 308A is also designated $SYNCH_{SECONDARY}$ and includes two serially-coupled D-type flip-flops designated $FF_{SS1}$ and $FF_{SS2}$. The first synchronizer 308A receives the signal (A) and the second clock signal $CLK_B$, and provides the $Z_2$ signal as shown in FIG. 3.

The detection stage 310A includes a D-type flip-flop designated $FF_{DET}$, whose Q output is coupled to an input of logic AND gate $U_2$. Another input of logic gate $U_2$ is coupled to the D input of the $FF_{DET}$ flip-flop and also receives the $Z_3$ signal.

The fault output stage 312A includes a D-type flip flop designated $FF_{FLT}$, whose D input receives the $Z_4$ signal, clock input receives the $CLK_B$ signal, and Q output generates the $FAULT_{O/P}$ signal, which is provided to a fault collector unit that is described in further detail below.

Finally, synchronizer circuit 300A also includes an XOR logic gate $U_1$ having a first input for receiving the $Z_1$ signal, a second input for receiving the $Z_2$ signal, and an output for generating the $Z_3$ signal.

Figure 4:
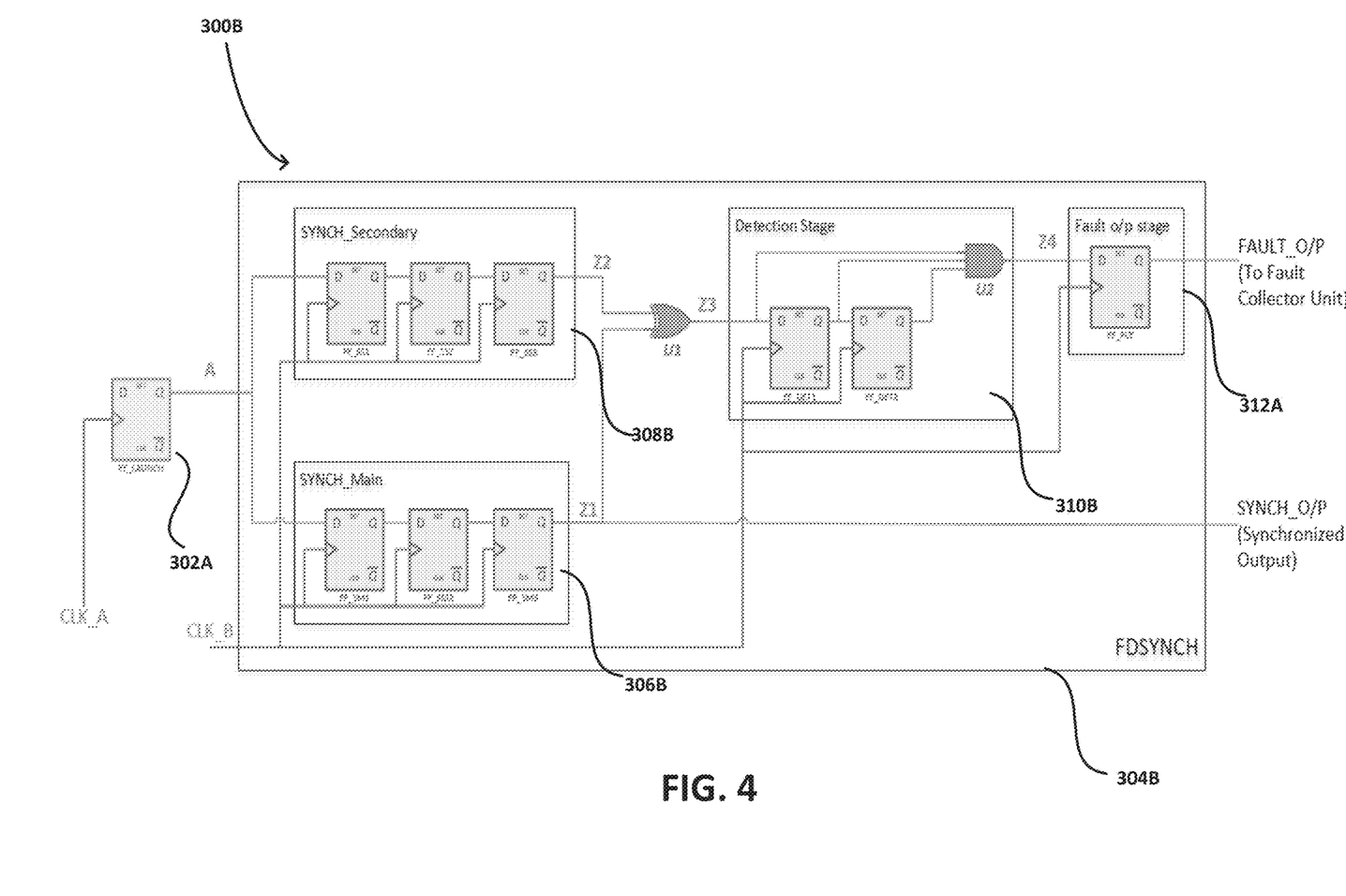
FIG. 4 is a schematic diagram of a synchronizer circuit having a synchronizer circuit output and a fault output according to another embodiment.

FIG. 4 is a schematic diagram of a synchronizer circuit 300B having a synchronizer circuit output (SYNCH O/P) and a fault output (FAULT O/P) according to another embodiment similar to the synchronizer circuit 300A shown in FIG. 3. The difference between the two synchronizer circuits is that the number of flip-flops is increased in the primary synchronizer 306B, secondary synchronizer 308B, and in the detection stage 310B, with respect to the embodiments shown in FIG. 3. Primary synchronizer 306B comprises three serially-coupled flip-flops designated $FF_{SM1}$, $FF_{SM2}$, and $FF_{SM3}$ instead of the two flip-flops shown in FIG. 3. Secondary synchronizer 308B comprises three serially-coupled flip-flops designated $FF_{SS1}$, $FF_{SS2}$, and $FF_{SS3}$ instead of the two flip-flops shown in FIG. 3. Detection stage 310B comprises two serially-coupled flip-flops designated $FF_{DET1}$ and $FF_{DET2}$ instead of the single flip-flop shown in FIG. 3.

FIGS. 3 and 4 illustrate embodiments wherein a specific number of serially-coupled flip-flop stages are used in the synchronizers and in the detection stage. However, any number of serially-coupled flip-flop stages can be used. In an embodiment, the number of flip-flop stages in the main and secondary synchronizers can be increased depending on the Mean Time Between Failure (MTBF) value of the flip-flop used in the synchronizer. An equation for the MTBF value is given below in equation [1]:

$$MTBF = \frac{e^{\frac{Ts}{\tau}}}{Tw \cdot Fc \cdot Fd} \quad [1]$$

wherein:
$T_S$=Settling Time (i.e. synchronizer clock period–clock to Q output time);
τ=Settling time constant of the flip-flop;
Tw=flip-flop window of susceptibility (when the D input transitions in this window the flip-flop becomes metastable);
Fc=Synchronizer Clock Frequency; and
Fd=Data Changing Frequency.

While a high value of MTBF is desirable to increase system design robustness, it will be appreciated by those skilled in the art there is a tradeoff to be made between the increased robustness achieved, and the increase in latency and integrated circuit area due to the inclusion of the additional flip-flops in the design.

Figure 5:
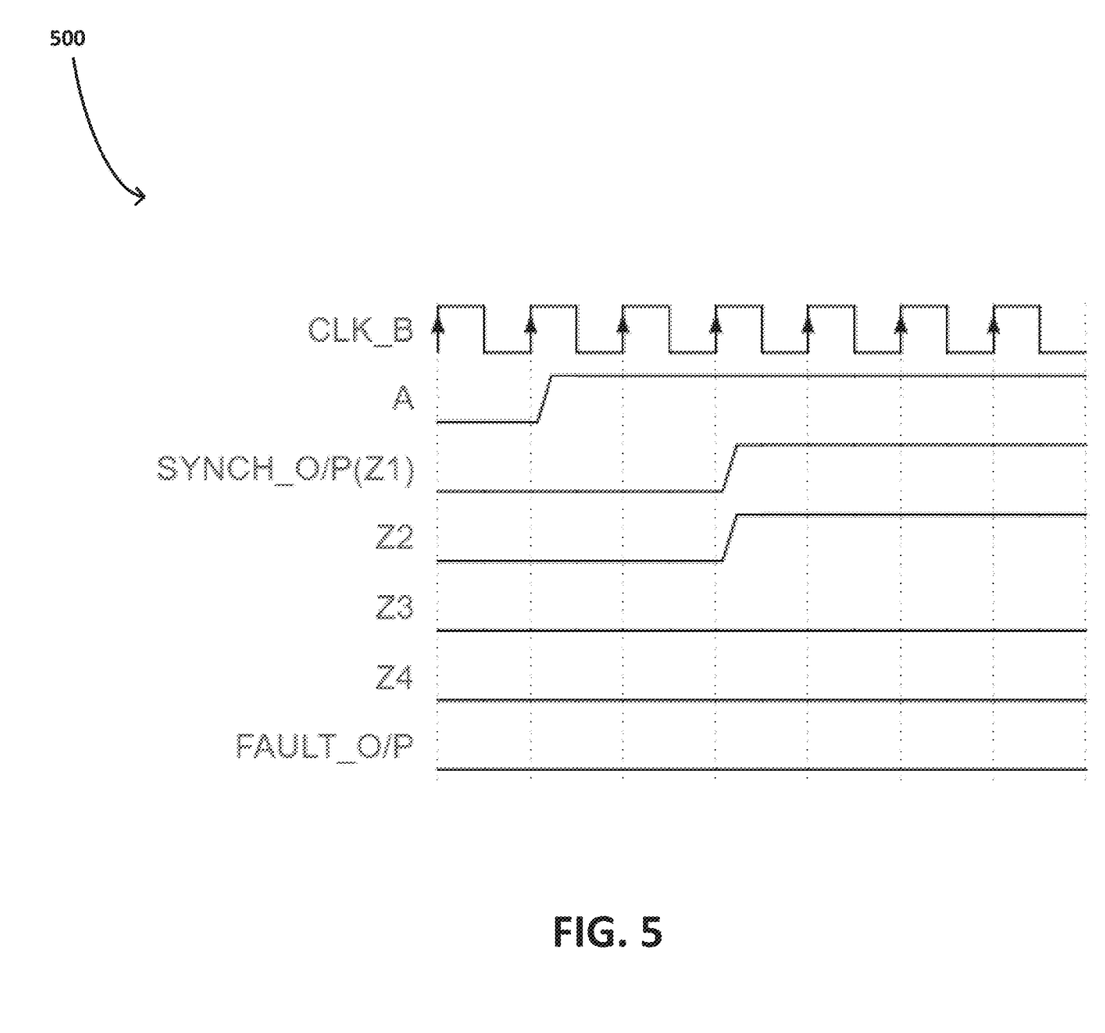
FIGS. 5 through 8 are timing diagrams associated with the schematic diagram of the synchronizer circuit of FIG. 3.
Figure 6:
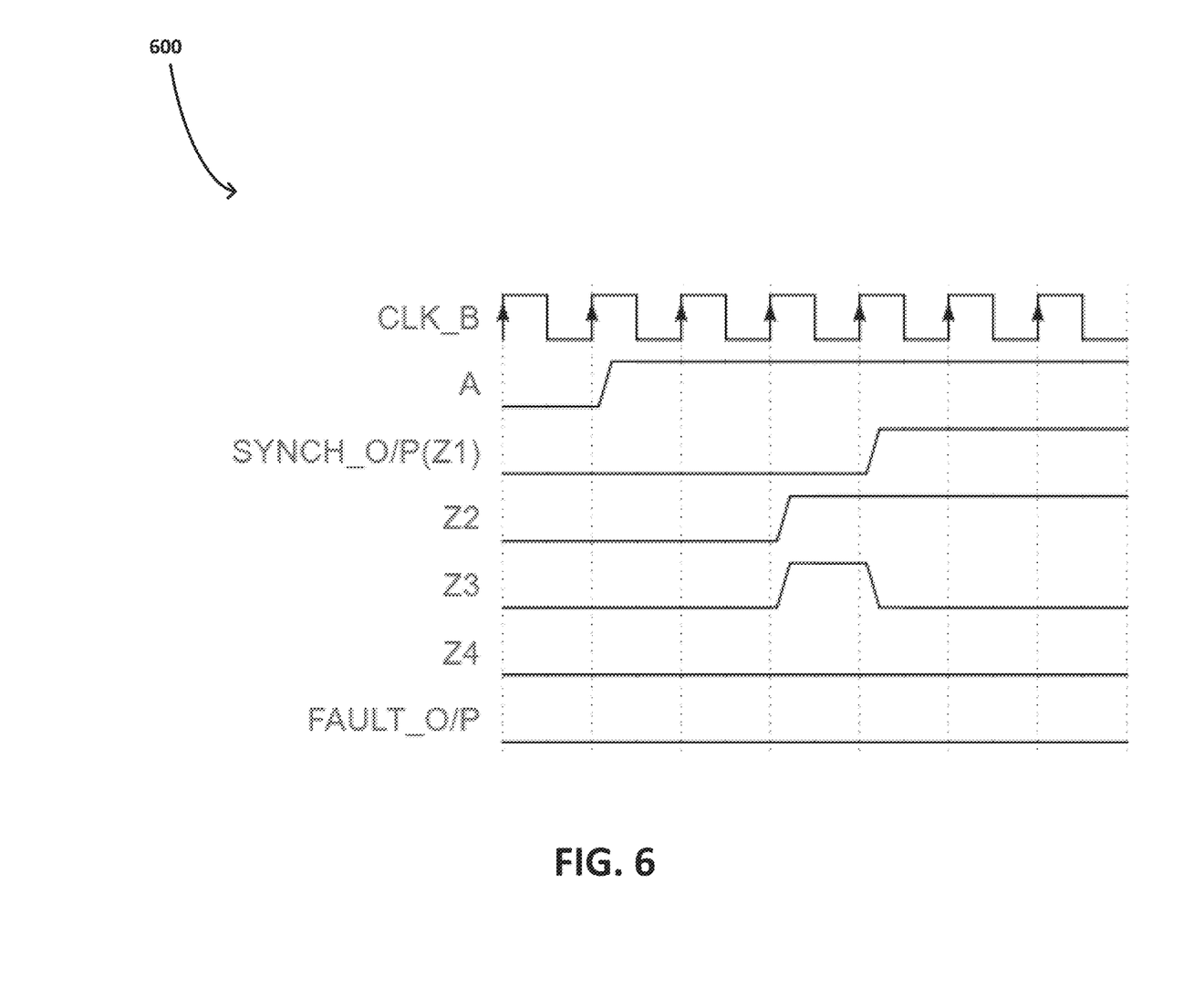
Figure 7:
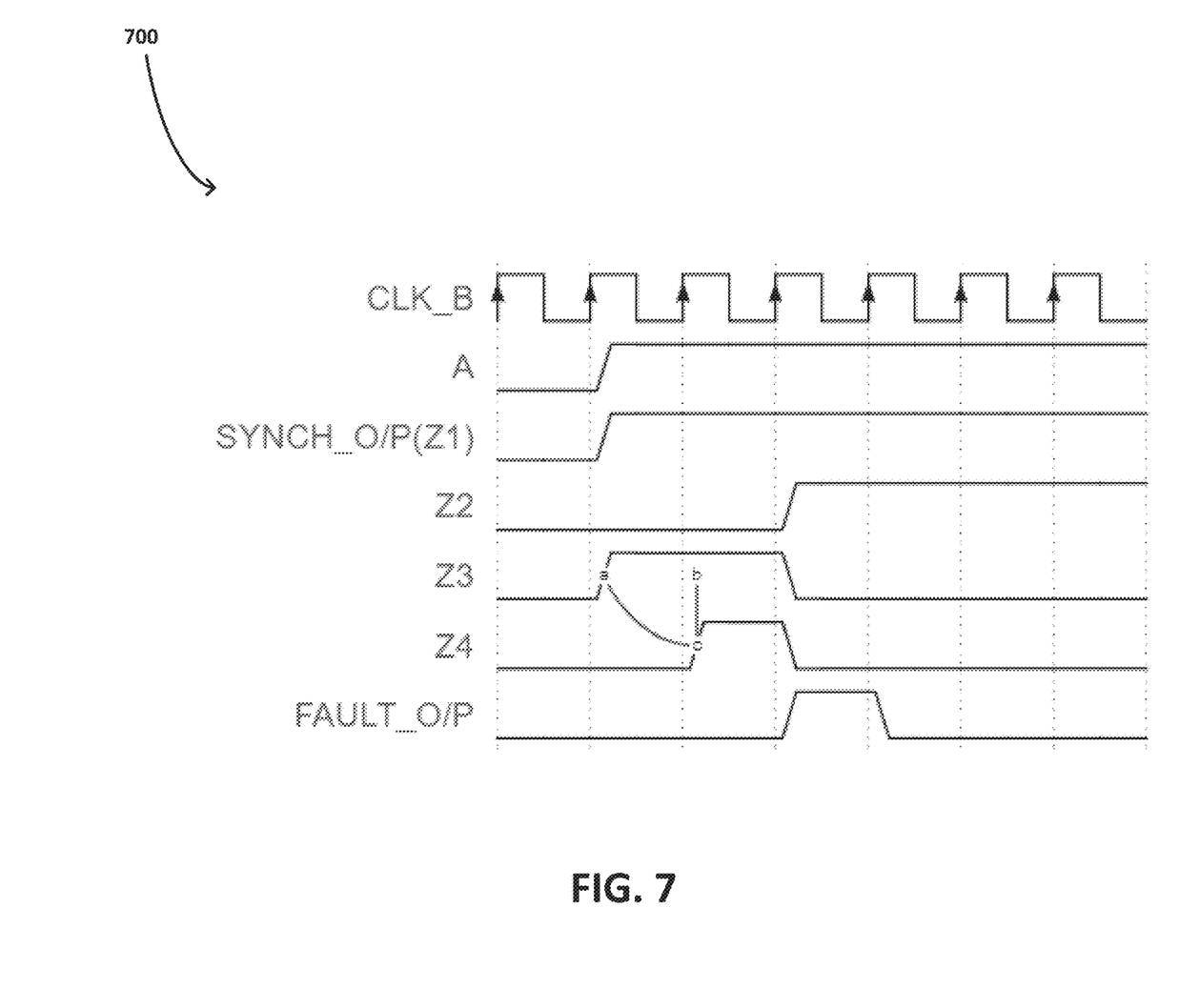
Figure 8:
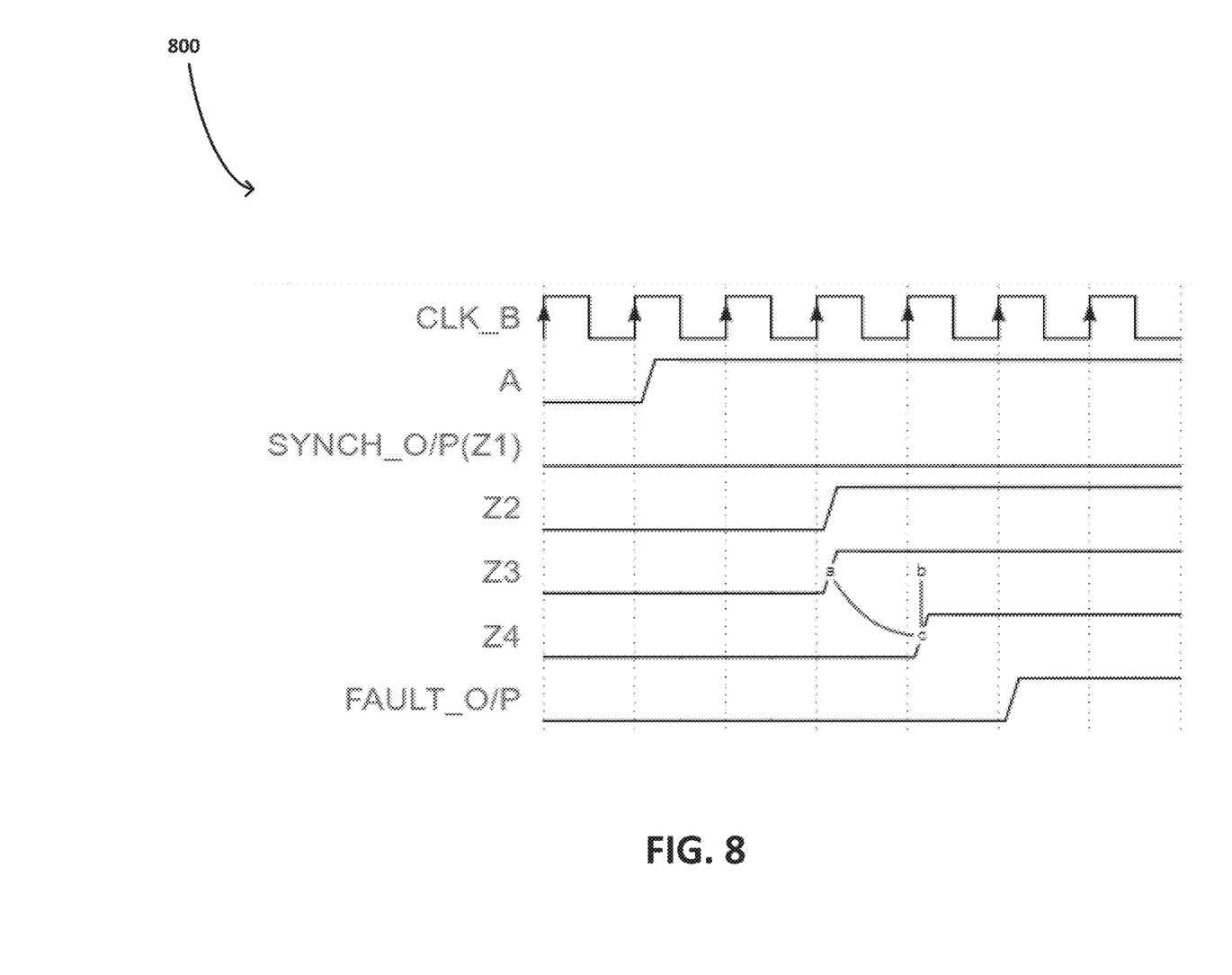

FIGS. 5 through 8 are timing diagrams associated with the synchronizer circuits illustrated in FIG. 3 and include waveforms for signals at the following nodes: CLKB, Signal A, $SYNCH_{O/P}$ ($Z_1$), $Z_2$, $Z_3$, $Z_4$, and $FAULT_{O/P}$. FIG. 5 does not include metastability or a fault signal output. FIG. 6 includes a metastability but does not include a fault signal output. FIGS. 7 and 8 illustrate cases of permanent and transient faults that are captured at a fault signal output.

The waveforms of FIG. 5 shows the output to the fault collector unit ($FAULT_{O/P}$) and the synchronized output ($SYNC_{O/P}$) when the $SYNC_{MAIN}$ and $SYNCH_{SECONDARY}$ synchronizers are able to sample the input signal A in the same cycle and thus do not show a one cycle uncertainty. The waveforms shown in FIG. 5 illustrate a normal operating mode and thus no fault signal is generated and the input signal is properly synchronized across clock domains.

The waveforms of FIG. 6 show the output to the fault collector unit ($FAULT_{O/P}$) and the synchronized output ($SYNC_{O/P}$) when the $SYNC_{MAIN}$ and $SYNCH_{SECONDARY}$ synchronizers have one cycle of uncertainty. The $Z_1$ signal is delayed by one cycle due to the one cycle of uncertainty. Still, the fault signal $FAULT_{O/P}$ is not generated, while the synchronized output signal $SYNC_{O/P}$ is working normally as in the previous example (although delayed by one clock cycle).

The waveforms of FIG. 7 show the synchronizer failure case when the $SYNCH_{MAIN}$ output ($Z_1$) transitions to and stays at a logic high value due to permanent fault in any one or all the flip-flop stages of $SYNCH_{MAIN}$ synchronizer. The additional logic circuit signals $Z_2$, $Z_3$, and $Z_4$ at times a, b, and c generate a fault signal ($FAULT_{O/P}$ transitioning to a logic high state). The $FAULT_{O/P}$ output signal can be advantageously used to take corrective action.

The waveforms of FIG. 8 show the synchronizer failure case when the $SYNCH_{MAIN}$ output remains at a logic low value due to permanent fault in any one or all the flip-flop stages of the $SYNCH_{MAIN}$ synchronizer. The additional logic circuit signals $Z_2$, $Z_3$, and $Z_4$ at times a, b, and c generate a fault signal ($FAULT_{O/P}$ transitioning to a logic high state). The $FAULT_{O/P}$ output signal can be advantageously used to take the corrective action.

In embodiments, a transient fault set to a logic high is covered by the action of the first flip-flop of the synchronizer. The next number of flip-flop stages (corresponding to a time of 2 or 3 cycles long, or "n" cycles long depending upon the number of flip-flops used) cover transient faults. Thus, the synchronizer circuit according to embodiments is able to detect long transient faults in addition to permanent faults without the need for additional special circuitry to detect such transient faults.

Figure 9:
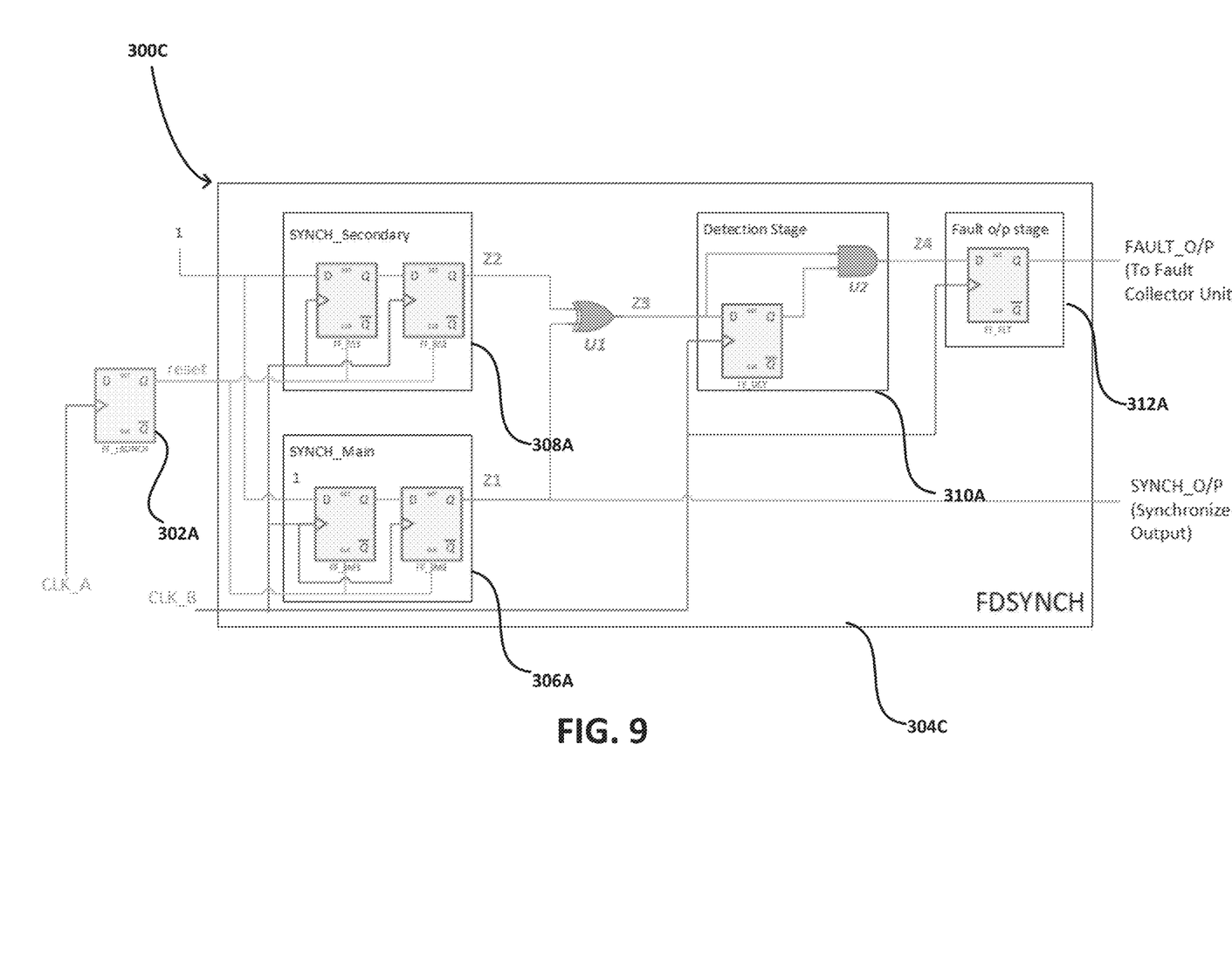
FIG. 9 is a schematic diagram of a synchronizer circuit having a synchronizer circuit output and a fault output according to yet another embodiment.

FIG. 9 is a schematic diagram of a synchronizer circuit 300C having a synchronizer circuit output and a fault output according to yet another embodiment that is similar to the synchronizer circuit 300A shown in FIG. 3. Synchronizer circuit 300C is adapted to synchronizer a RESET signal across clock domains. The secondary portion 304C of synchronizer 300C is differently labeled from the secondary portion 304A of synchronizer 300A to reflect the different signals that are present. Thus the differences between synchronizer circuit 300C and synchronizer circuit 300A include the Q output of the $FF_{LAUNCH}$ flip-flop being used to generate a RESET signal, and the D inputs of the $FF_{SM1}$ and the $FF_{SS1}$ flip-flops being tied to a logic high signal. In addition, the RESET signal is coupled to the CLR inputs of the $FF_{SM1}$, $FF_{SM2}$, $FF_{SS1}$, and $FF_{SS2}$ flip-flops. The operation of the synchronizer circuit 300C is substantially the same as previous described, except that the $SYNCH_{O/P}$ signal is configured to synchronize the RESET signal across clock domains. The $FAULT_{O/P}$ fault signal operates substantially as previous described to detect faults in the primary synchronizer 306A or in the secondary synchronizer 308A.

Figure 10:
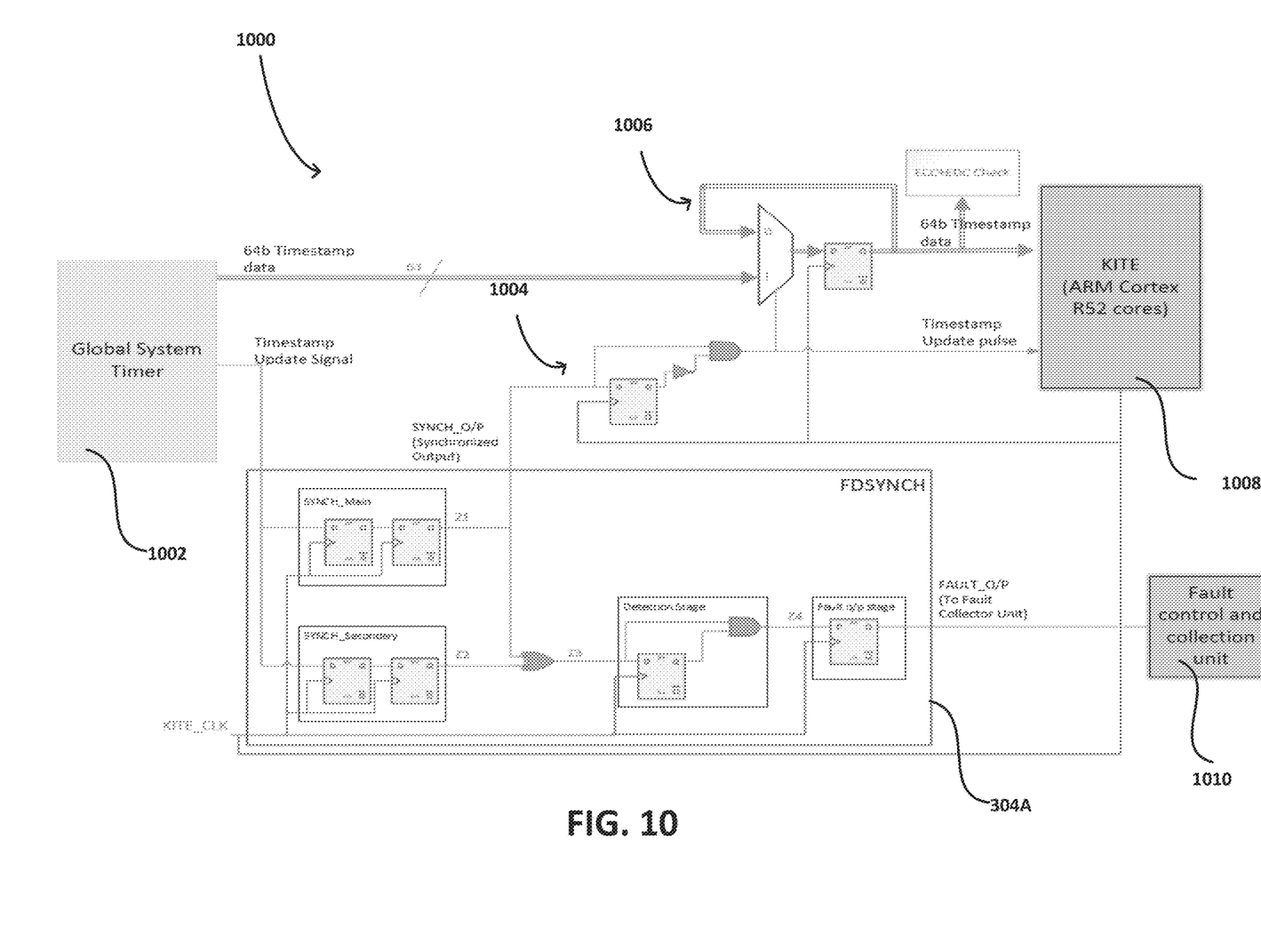
FIG. 10 is a block diagram of a system including a synchronizer circuit according to an embodiment.

FIG. 10 is a block diagram 1000 of a representative system having two clock domains including a synchronizer circuit 304A (FDSYNCH) according to an embodiment. In the system of FIG. 10, the signal source is provided by a global system timer 1002 associated with a first clock domain for providing the timestamp update signal. The global system timer 1002 provides timestamp data to a microprocessor 1008 through a digital bus and digital circuitry 1006. The FDSYNCH synchronizer circuit receives the timestamp update signal and the second clock domain clock signal ($KITE_{CLK}$) to generate the $SYNCH_{O/P}$ synchronized output signal as shown. The synchronized output signal and the $KITE_{CLK}$ are logically combined together by logic circuitry 1004 to generate a timestamp update pulse that is also received by the microprocessor 1008. The fault output signal ($FAULT_{O/P}$) is also generated by synchronizer circuit 304A, which is received by the fault control and collection unit 1020. In an embodiment, fault control and collection unit 1020 can directly take action to reset the system or otherwise address the detected fault condition. The fault control and collection unit 1020 can comprise, for example, a plurality of registers that are used to decide the action type corresponding to the fault input. For example, representative actions can include resetting one or more system devices, resetting the source of the fault, remapping a faulty device to a backup device, or other such actions or combination of actions. The specific action taken can be decided as required by the application software used in a particular system.

Figure 11:
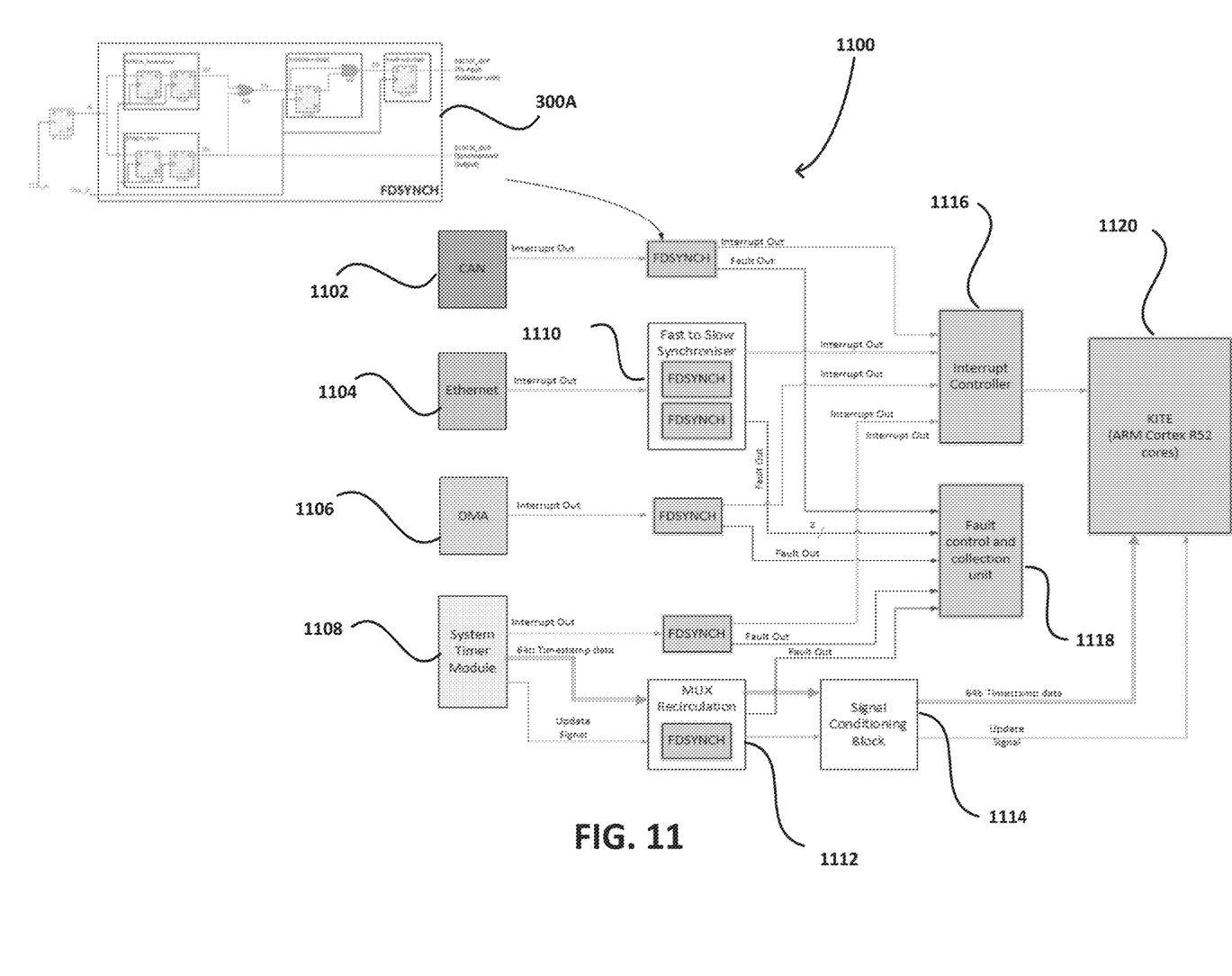
FIG. 11 is a block diagram of a system including a synchronizer circuit according to another embodiment.

FIG. 11 is a block diagram 1100 of a representative system including a plurality of signal sources and synchronizer circuits 300A according to another embodiment. The second clock signal is not shown in FIG. 11 for sake of clarity in the drawing figure. In FIG. 11, a synchronizer circuit 300A is coupled between a signal source and an interrupt controller 1116 (for the synchronized output signal designated Interrupt Out) and a fault control and collection unit 1118 (for the fault output signal designated Fault Out). In FIG. 11, the interrupt controller 1116 is also coupled to the microprocessor 1120. The representative system shown in FIG. 11 is an example of how the FDSYNCH synchronizer can be used in a system, and includes the following representative signal sources: Controlled Area Network block (CAN) 1102, which is typically used for in-vehicle communication, an Ethernet block 1104, a Direct Memory Access block (DMA) 1106, and a system timer module 1108. Each of the signals sources generates at least an interrupt signal designated Interrupt Out. The Ethernet block is coupled to a "Fast to Slow" Synchronizer (designed to capture a pulse coming from a high frequency domain and going to a low frequency domain) including two FDSYNCH synchronizer circuits. The system timer modules also includes a MUX Recirculation circuit (previously shown for example as logic circuit 1006 in FIG. 10) coupled to a signal conditioning block 1114 (previously shown for example as logic circuit 1004 shown in FIG. 10). The signal conditioning block 1114 is in turn coupled to the microprocessor 1120.

FIGS. 10 and 11 have shown examples of systems that can benefit from the synchronizer circuits described herein, having one or more signal sources crossing clock domains, wherein the synchronizer circuits include both a synchronized output signal in communication with a microprocessor, and a fault detection output signal in communication with a fault control and collection unit. Many such electronic systems can benefit from the synchronizer circuits described herein covering a wide variety of applications, including automotive applications.

Finally, the synchronizer circuit described herein can be made even more robust (less susceptible to flip-flop failure) through the use of triple-voting flip-flop circuits in both the detection stage and the fault output stage.

Figure 12:
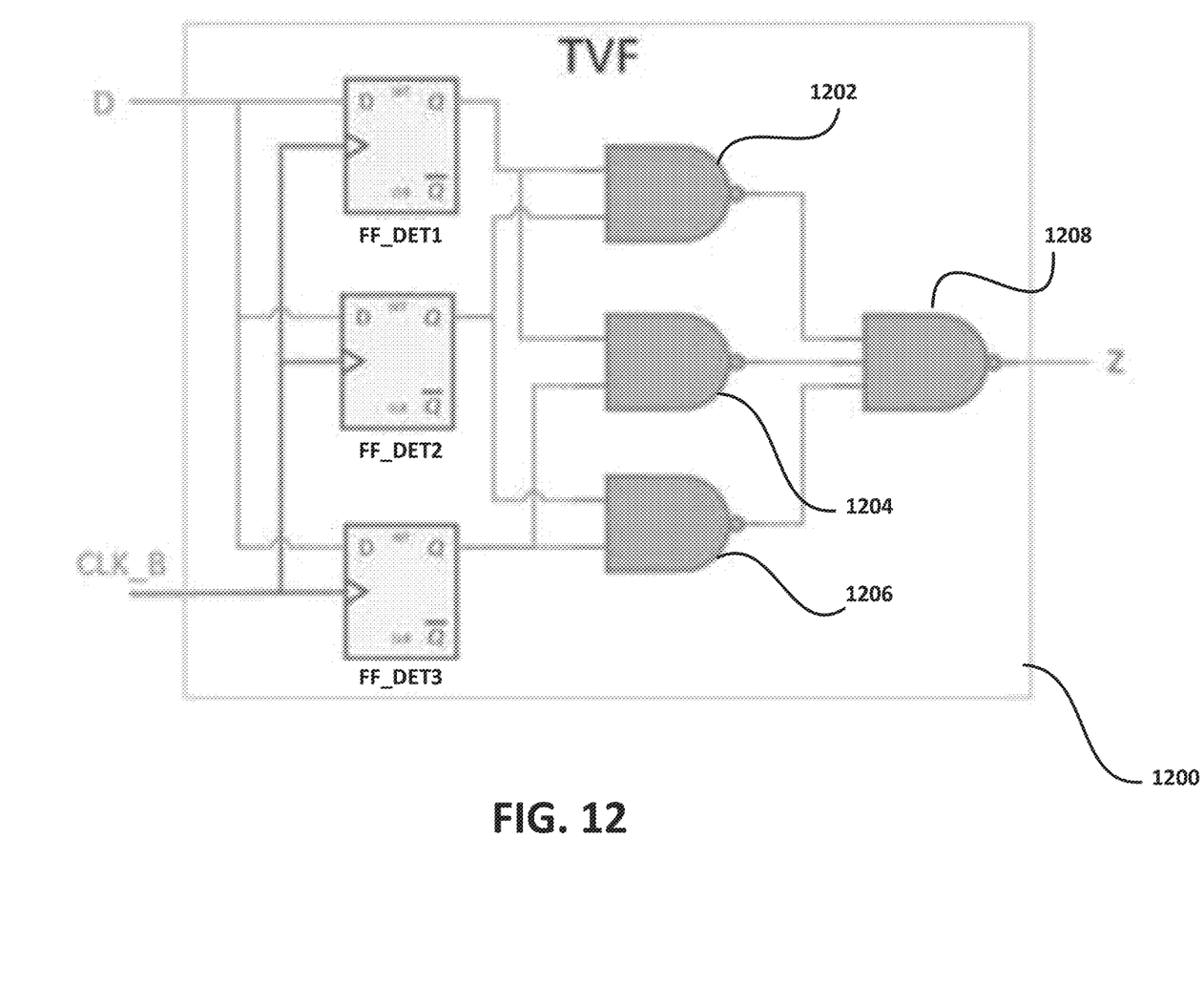
FIG. 12 is a schematic diagram of an exemplary triple-voting flip-flop circuit.

FIG. 12 is a schematic diagram of an exemplary triple-voting flip-flop (TVF) circuit 1200. Flip-flop circuit 1200 includes three parallel flip-flops $FF_{DET1}$, $FF_{DET2}$, and $FF_{DET3}$. The D inputs of the three parallel flip-flops are coupled together, and the clock inputs of the three inputs are coupled together to receive the $CLK_B$ clock signal. The Q output of $FFDET_1$ is coupled to the first input of NAND gate 1202 and the first input of NAND gate 1204. The Q output of $FFDET_2$ is coupled to the second input of NAND gate 1202 and the first input of NAND gate 1206. The Q output of $FFDET_3$ is coupled to the second input of NAND gate 1204 and the second input of NAND gate 1206. The outputs of NAND gates 1202, 1204, and 1206 are received by the three-input NAND gate 1208 to generate the appropriate Z output signal. While a triple-voting flip-flop circuit 1200 has been described and illustrated in FIG. 12, other such TVF circuits are known and can be used in embodiment synchronizer circuits.

Figure 13:
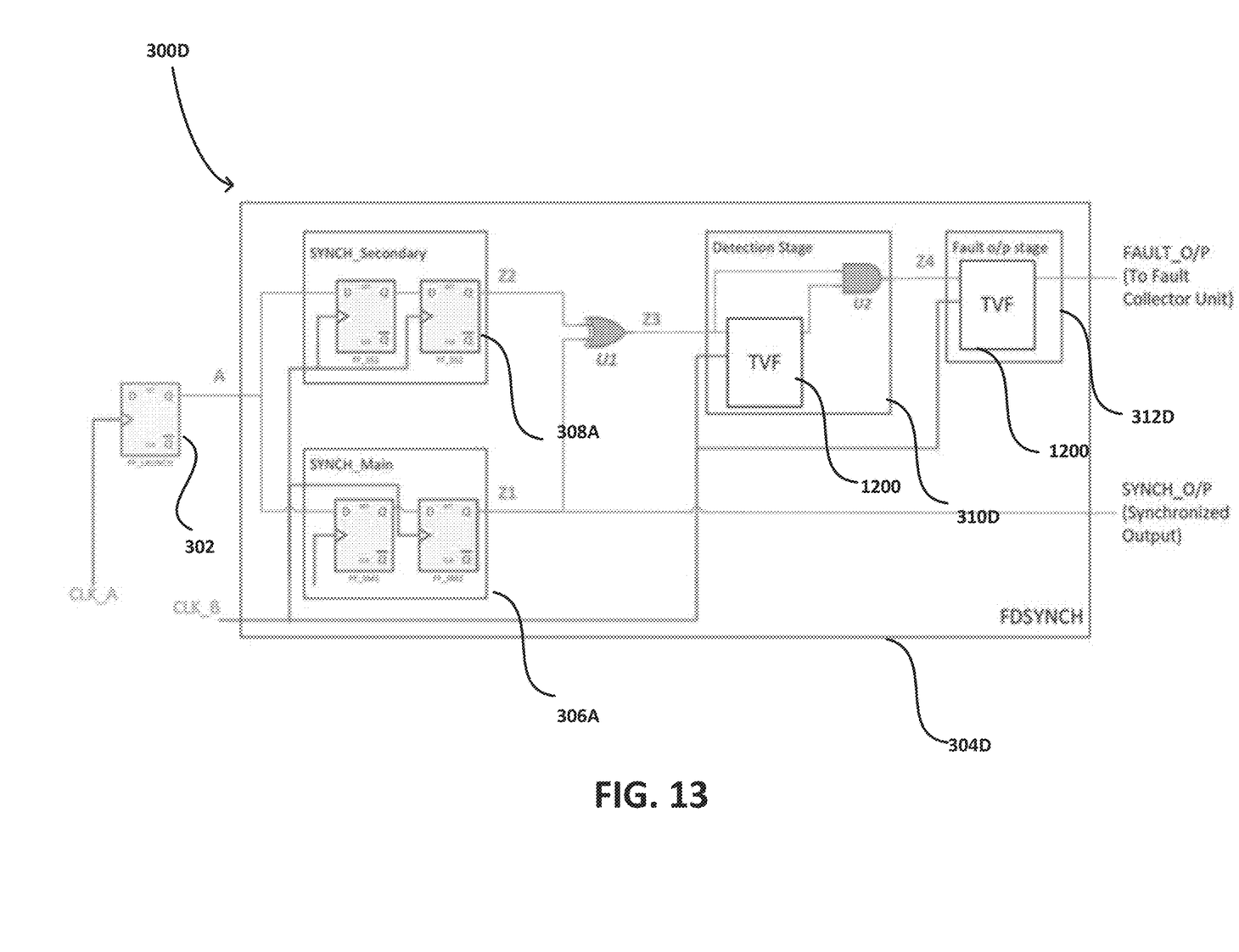
FIG. 13 is a schematic diagram of a synchronizer circuit having a synchronizer circuit output and a fault output according to yet another embodiment.

FIG. 13 is a schematic diagram of a synchronizer circuit 300D having a synchronizer circuit output and a fault output according to yet another embodiment, and is similar in nature to synchronizer circuit 300A previously described, but wherein a TVF circuit 1200 is used in the detection stage 310D and also in the fault output stage 312D.

It is an advantage that embodiment synchronizer circuits include a fault detection output that can detect both logic high and logic low faults in either the main synchronizer or the secondary synchronizer, since both synchronizer outputs are compared. For critical fault conditions, the synchronizer circuit can be made even more robust by the inclusion of TVF circuits in the detection stage and the fault output stage.

It is a further advantage that multiple embodiment synchronizer circuits can be used in a system including numerous signal inputs that are all crossing from a first clock domain to a second clock domain. The embodiment synchronizer circuits can be used in many different system applications including but not limited to an automotive application.

In an embodiment, the fault output stage previously described can be removed if its output is used in same clock domain. Where the fault output is received in the same clock domain (the second clock signal) there is no need to use the fault output stage.

Example embodiments of the present invention are summarized here. Other embodiments can also be understood from the entirety of the specification and the claims filed herein.

Example 1. According to an embodiment, a synchronizer circuit comprises a first synchronizer having a first input for receiving a signal associated with a first clock signal, a second input for receiving a second clock signal, and an output for providing a synchronizer circuit output signal; a second synchronizer having a first input for receiving the signal associated with the first clock signal, a second input for receiving the second clock signal, and an output; a detection stage having a first input coupled to the output of the first synchronizer and to the output of the second synchronizer, a second input for receiving the second clock signal, and an output; and a fault output stage having a first input coupled to the detection stage, a second input for receiving the second clock signal, and an output for providing a fault output signal.

Example 2. The synchronizer circuit of Example 1, further comprising a flip-flop having an input for receiving the first clock signal, and an output coupled to the first input of the first synchronizer and to the first input of the second synchronizer.

Example 3. The synchronizer circuit of any of the previous examples, wherein the first input of the first synchronizer and the first input of the second synchronizer each comprise a "D" flip-flop input.

Example 4. The synchronizer circuit of any of the previous examples, wherein the first input of the first synchronizer and the first input of the second synchronizer each comprise a "CLR" flip-flop input.

Example 5. The synchronizer circuit of any of the previous examples, further comprising an XOR gate interposed between the outputs of the first and second synchronizers, and the first input of the detection stage.

Example 6. The synchronizer circuit of any of the previous examples, wherein the first synchronizer comprises two serially coupled flip-flops.

Example 7. The synchronizer circuit of any of the previous examples, wherein the first synchronizer comprises three serially coupled flip-flops.

Example 8. The synchronizer circuit of any of the previous examples, wherein the second synchronizer comprises two serially coupled flip-flops.

Example 9. The synchronizer circuit of any of the previous examples, wherein the second synchronizer comprises three serially coupled flip-flops.

Example 10. The synchronizer circuit of any of the previous examples, wherein the detection stage comprises a flip-flop coupled to a logic gate.

Example 11. The synchronizer circuit of any of the previous examples, wherein the detection stage comprises two serially coupled flip-flops coupled to a logic gate.

Example 12. The synchronizer circuit of any of the previous examples, wherein the detection stage comprises a triple-voting flip-flop circuit coupled to a logic gate.

Example 13. The synchronizer circuit of any of the previous examples, wherein the fault output stage comprises a flip-flop.

Example 14. The synchronizer circuit of any of the previous examples, wherein the fault output stage comprises a triple-voting flip-flop circuit.

Example 15. According to an embodiment, a system comprises a plurality of synchronizer circuits, each synchronizer circuit having a first input for receiving a first signal associated with a first clock domain, a second input for receiving a second signal associated with a second clock domain, a first output for providing a synchronizer circuit output signal, and a second output for providing a fault output signal; a controller having a plurality of inputs each coupled to a corresponding first output of the plurality of synchronizer circuits; and a fault control and collection unit coupled to a corresponding second output of the plurality of synchronizer circuits.

Example 16. The system of Example 15, further comprising a microprocessor coupled to an output of the controller.

Example 17. The system of any of the previous examples, further comprising a signal conditioning block coupled between one of the synchronizer circuits and the microprocessor.

Example 18. According to an embodiment, a synchronization method for a synchronizer circuit comprises receiving a signal associated with a first clock domain; receiving a clock signal associated with a second clock domain; providing a synchronized output signal associated with the second clock domain; and providing a fault output signal indicative of a fault associated with at least one synchronizer of the synchronizer circuit.

Example 19. The synchronization method of Example 18, further comprising selecting a number of flip-flops for the at least one synchronizer of the synchronizer circuit according to a mean time between failure of the at least one synchronizer.

Example 20. The synchronization method of any of the previous examples, wherein the synchronized output signal is provided from a main synchronizer of the synchronizer circuit, and wherein the fault output signal is provided by a secondary synchronizer of the synchronizer circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A synchronizer circuit comprising:
a first synchronizer having a first input for receiving a signal associated with a first clock signal, a second input for receiving a second clock signal, and an output for providing a synchronizer circuit output signal;
a second synchronizer having a first input for receiving the signal associated with the first clock signal, a second input for receiving the second clock signal, and an output;
a detection stage having a first input coupled to the output of the first synchronizer and to the output of the second synchronizer, a second input for receiving the second clock signal, and an output; and
a fault output stage having a first input coupled to the detection stage, a second input for receiving the second clock signal, and an output for providing a fault output signal.

2. The synchronizer circuit of claim 1, further comprising a flip-flop having an input for receiving the first clock signal, and an output coupled to the first input of the first synchronizer and to the first input of the second synchronizer.

3. The synchronizer circuit of claim 2, wherein the first input of the first synchronizer and the first input of the second synchronizer each comprise a "D" flip-flop input.

4. The synchronizer circuit of claim 2, wherein the first input of the first synchronizer and the first input of the second synchronizer each comprise a "CLR" flip-flop input.

5. The synchronizer circuit of claim 1, further comprising an XOR gate interposed between the outputs of the first and second synchronizers, and the first input of the detection stage.

6. The synchronizer circuit of claim 1, wherein the first synchronizer comprises two serially coupled flip-flops.

7. The synchronizer circuit of claim 6, wherein the second synchronizer comprises two serially coupled flip-flops.

8. The synchronizer circuit of claim 1, wherein the first synchronizer comprises three serially coupled flip-flops.

9. The synchronizer circuit of claim 8, wherein the second synchronizer comprises three serially coupled flip-flops.

10. The synchronizer circuit of claim 1, wherein the detection stage comprises a flip-flop coupled to a logic gate.

11. The synchronizer circuit of claim 1, wherein the detection stage comprises two serially coupled flip-flops coupled to a logic gate.

12. The synchronizer circuit of claim 1, wherein the detection stage comprises a triple-voting flip-flop circuit coupled to a logic gate.

13. The synchronizer circuit of claim 1, wherein the fault output stage comprises a flip-flop.

14. The synchronizer circuit of claim 1, wherein the fault output stage comprises a triple-voting flip-flop circuit.

15. A synchronizer circuit comprising:
a first synchronizer configured for receiving a signal associated with a first clock signal, for receiving a second clock signal, and for providing a first synchronizer circuit output signal;
a second synchronizer configured for receiving the signal associated with the first clock signal and for receiving the second clock signal, and for providing a second synchronizer circuit output signal;
a logic circuit for logically combining the first synchronizer circuit output signal and the second synchronizer circuit output signal;
a detection stage coupled to an output of the logic circuit, and configured for receiving the second clock signal; and
a fault output stage coupled to an output of the detection stage, configured for receiving the second clock signal, and configured for providing a fault output signal.

16. The synchronizer circuit of claim 15, further comprising a flip-flop configured for receiving the first clock signal, and coupled to the first synchronizer and to the second synchronizer.

17. The synchronizer circuit of claim 15, wherein at least the first synchronizer or the second synchronizer comprises a plurality of flip-flops.

18. A synchronization method for a synchronizer circuit, the method comprising:

receiving a signal associated with a first clock domain by parallel-connected synchronizers of the synchronizer circuit;

receiving a clock signal associated with a second clock domain by the parallel-connected synchronizers of the synchronizer circuit;

providing a synchronized output signal associated with the second clock domain by an output of one of the synchronizers of the synchronizer circuit;

logically combining outputs of the parallel-connected synchronizers of the synchronizer circuit to provide a logic signal; and providing a fault output signal indicative of a fault associated with at least one synchronizer of the synchronizer circuit by a detection stage circuit having a first input for receiving the logic signal, a second input for receiving the clock signal associated with the second clock domain, and an output for providing the fault output signal.

19. The synchronization method of claim 18, further comprising selecting a number of flip-flops for the at least one synchronizer of the synchronizer circuit according to a mean time between failure of the at least one synchronizer.

20. The synchronization method of claim 18, wherein the synchronized output signal is provided from a main synchronizer of the synchronizer circuit, and wherein the fault output signal is provided by a secondary synchronizer of the synchronizer circuit.

* * * * *